(12) United States Patent
Hsieh et al.

(10) Patent No.: US 8,207,539 B2
(45) Date of Patent: Jun. 26, 2012

(54) LIGHT-EMITTING DEVICE HAVING A THINNED STRUCTURE AND THE MANUFACTURING METHOD THEREOF

(75) Inventors: Min-Hsun Hsieh, Hsinchu (TW); Chih-Chiang Lu, Hsinchu (TW); Chien-Yuan Wang, Hsinchu (TW); Yen-Wen Chen, Hsinchu (TW); Jui-Hung Yeh, Hsinchu (TW); Shih-Chin Hung, Hsinchu (TW); Yu-Wei Tu, Hsinchu (TW); Chun-Yi Wu, Hsinchu (TW); Wei-Chih Peng, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 12/481,048

(22) Filed: Jun. 9, 2009

(65) Prior Publication Data

US 2010/0308355 A1 Dec. 9, 2010

(51) Int. Cl.
*H01L 27/15* (2006.01)
*H01L 31/12* (2006.01)
*H01L 33/00* (2010.01)

(52) U.S. Cl. ........................................... 257/79; 257/98

(58) Field of Classification Search ................... 257/79, 257/98
See application file for complete search history.

(56) References Cited

U.S. PATENT DOCUMENTS

| 7,045,223 | B2 | 5/2006 | Kokta et al. | |
|---|---|---|---|---|
| 7,105,857 | B2 | 9/2006 | Nagahama et al. | |
| 7,488,988 | B2* | 2/2009 | Lin et al. | 257/94 |
| 7,777,240 | B2* | 8/2010 | Lin et al. | 257/94 |
| 2004/0090179 | A1* | 5/2004 | Lin | 313/506 |
| 2004/0217360 | A1* | 11/2004 | Negley | 257/79 |
| 2005/0233679 | A1 | 10/2005 | Blaum et al. | |
| 2006/0076571 | A1* | 4/2006 | Hsieh et al. | 257/99 |
| 2006/0278885 | A1* | 12/2006 | Tain et al. | 257/99 |
| 2008/0230791 | A1* | 9/2008 | Lin et al. | 257/91 |
| 2010/0213485 | A1* | 8/2010 | McKenzie et al. | 257/98 |

* cited by examiner

*Primary Examiner* — Thien F Tran
(74) *Attorney, Agent, or Firm* — Muncy, Geissler, Olds & Lowe, PLLC

(57) ABSTRACT

A semiconductor light-emitting device having a thinned structure comprises a thinned structure formed between a semiconductor light-emitting structure and a carrier. The manufacturing method comprises the steps of forming a semiconductor light-emitting structure above a substrate; attaching the semiconductor light-emitting structure to a support; thinning the substrate to form a thinned structure; forming or attaching a carrier to the thinned substrate; and removing the support.

29 Claims, 16 Drawing Sheets

LIGHT-EMITTING DEVICE HAVING A THINNED STRUCTURE AND THE MANUFACTURING METHOD THEREOF

BACKGROUND OF THE DISCLOSURE

1. Technical Field

This disclosure relates to a light-emitting device having a thinned structure and the manufacturing method thereof.

2. Description of the Related Art

Semiconductor light-emitting devices such as light-emitting diode (LED) have continuing improvement in brightness recently, and the applied field is expanded from conventional signals or decorative use to light sources for various apparatus. Even in the coming future, it is possible for LEDs to replace the traditional fluorescent lamps as the new generational light source in the illuminating field.

Currently the internal quantum efficiency (IQE) of light-emitting diode is about 50% to 80%, and about 20% to 50% of the input power can not be transferred into light but heat generated in the light-emitting diode. When the heat can not be dissipated from the light-emitting diode effectively, the heat results in temperature rising in the light-emitting diode, and the reliability of the light-emitting diode is therefore decreased. In addition, when the light generated by the light-emitting diode can not be extracted effectively, part of the light is confined in the light-emitting diode due to the totally internal reflection and reflected or refracted to and fro in the light-emitting diode, and is absorbed by electrode or light-emitting layer finally which causes lower brightness.

SUMMARY OF THE DISCLOSURE

The present disclosure provides an innovative plan solving the accumulation of heat in the light emitting diode through decreasing the thermal resistivity of the light emitting diode and improving the efficiency of the light extraction. The present disclosure also provides a light-emitting device applied to high power output for lighting field.

Accordingly, this disclosure provides a light-emitting device having a thinned structure, a semiconductor light-emitting structure deposed on a first side of the thinned structure including a first-type conductivity semiconductor layer, an active layer, and a second-type conductivity semiconductor layer, a carrier deposed on the other side of the thinned structure, and at least a channel formed in the thinned structure.

This disclosure also provides a method of manufacturing a light-emitting device, the method having steps of providing a substrate, forming a semiconductor light-emitting structure above the substrate; providing a support; attaching the semiconductor light-emitting structure to the support; thinning the substrate to form a thinned structure; forming at least a channel in the thinned structure, and forming or attaching a carrier to the thinned substrate In accordance with one embodiment of the disclosure, the method further includes thinning the substrate by a chemical mechanical polishing.

In accordance with one embodiment of the disclosure, the method further includes forming the channel by laser beam.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1:
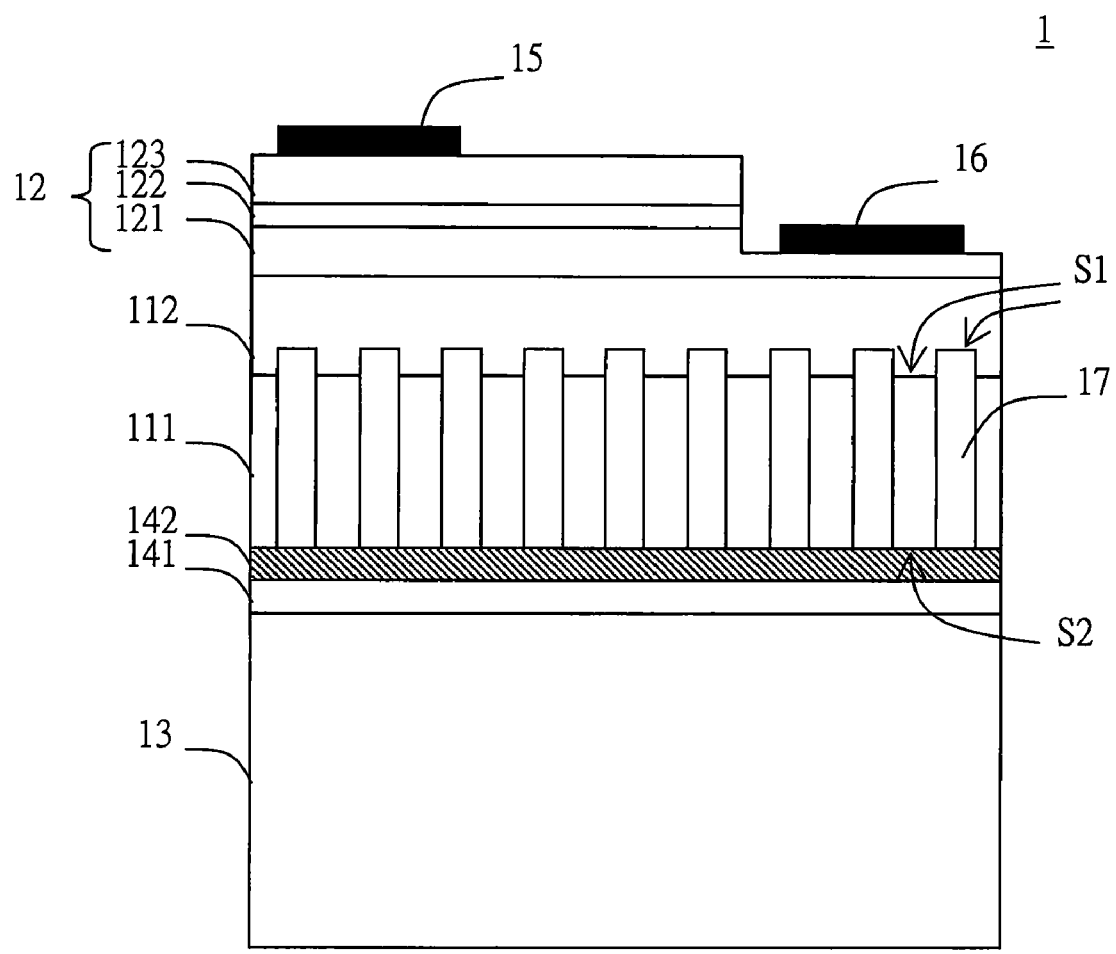
FIG. 1 is a cross-sectional view of a horizontal light-emitting device in accordance with a first embodiment of the present disclosure.

Reference will now be made in detail to the preferred embodiments of the present disclosure, examples of which are illustrated in the accompanying drawings. Wherever possible, the same reference numbers are used in the drawings and the description to refer to the same or like parts.

FIG. 1 shows the cross-sectional view of a horizontal light-emitting device 1 in accordance with an embodiment of the present disclosure. The light-emitting device 1 includes a thinned substrate 111 having a top surface S1 and a lower surface S2, a semiconductor buffer layer 112 deposed on the top surface S1, a semiconductor light-emitting structure 12 deposed on the semiconductor buffer layer 112 including a first-type conductivity semiconductor layer 121, an active layer 122, and a second-type conductivity semiconductor layer 123, wherein part of the semiconductor light-emitting structure 12 is removed to expose part of the first-type conductivity semiconductor layer 121, a reflective layer 142 deposed on the lower surface S2 of the thinned substrate 111, a carrier 13 attached to the reflective layer 142 by a intermediate layer 141, a first wire pad 15 and a second wire pad 16 electrically connected to the second-type conductivity semiconductor layer 123 and the first-type conductivity semiconductor layer 121 respectively, and wherein the first wire pad 15 and the second wire pad 16 are deposed on the same side of the thinned substrate 111, and multiple first channels 17 passing through the thinned substrate 111 and extending to a depth of the semiconductor buffer layer 112. The thinned substrate 111 is formed by thinning a growth substrate used to grow the semiconductor buffer layer 112 and the semiconductor light-emitting structure 12. The material of the growth substrate includes at least one of material selected from the group consisting of GaAs, sapphire, SiC, GaN, and AlN, and the thermal conductivity of the material is usually not greater than that of the carrier 13. In order to decrease the thermal resistivity of the light-emitting device efficiently, the growth substrate is thinned from the original thickness of more than 200 μM or 300 μm to a thickness no greater than 50 μm to form the thinned substrate 111 after growing the semiconductor buffer layer 112 and the semiconductor light-emitting structure 12 on the growth substrate. The better thickness of the thinned substrate 111 is no greater than 40 μm, no greater than 30 μm, no greater than 20 μm, or no greater than 10 μm, and an even better thickness is no greater than 5 μm. Besides, in order to maintain the process reliability, the semiconductor buffer layer 112 is used to avoid damage of the semiconductor light-emitting structure 12 resulted from variations produced by a difference of thinning speed or thinning uniformity during thinning the growth substrate. The thinned structure formed by the thinned substrate 111 and the semiconductor buffer layer 112 still has to maintain a thickness, and the better thickness is no less than 2 μm to maintain the process reliability. The thermal conductivity of the carrier 13 is no less than that of the thinned substrate 111 to decrease the thermal resistivity of the light-emitting device. The carrier 13 includes materials with thermal conductive coefficient no less than 50 W/m·°C., and the better is no less than 100 W/m·°C., such as silicide, carbide, metal, metal alloy, metal oxide, metal composite, diamond, or diamond-like carbon. It is able to add material with low expansive coefficient to decrease a strain caused by the carrier. A first channel 17 includes a transparent material such as silicon oxide, silicon nitride, organic polymer, or air. The difference between the refractive index of the first channel 17 and that of the thinned substrate 111 is at least greater than 0.1 to increase the light extractive efficiency. The material of the first channel 17 also includes a high thermal conductive transparent material such as silicon carbide, zinc oxide, or diamond to decrease thermal resistivity of the device and increase the light extractive efficiency. In one embodiment, multiple first channels 17 pass through the thinned substrate 111 and extend to the semiconductor buffer layer 112 with a depth of about 0.1-1 μm to produce a contact interface between the thinned substrate 111 and multiple first channels 17 so a concave-convex top surface S1 is formed to increase the light scattering, and then increase the light extraction efficiency. Multiple first channels 17 are arranged in a periodic two dimension order, but it also could be arranged in a quasi-periodic, varied periodic, or irregular order, such as a two dimension ordered arrangement formed with cylinders or polygonal columns with a diameter of about 1-10 μm, or multiple rectangular channels in a cross-linking arrangement such as meshed arrangement. The intermediate layer 141 can be an adhesive layer to adhere the carrier 13 and the reflective layer 142. In another embodiment, the intermediate layer 141 can be a seed layer for electroplating to form the carrier 13 on it. In another embodiment, the intermediate layer 141 can also be a diffusion barrier layer to inhibit a cross diffusion between the intermediate layer 141 and the carrier 13 to affect the material characteristic. The material of the first-type conductivity semiconductor layer 121, the active layer 122, or the second-type conductivity semiconductor layer 123 includes $Al_pGa_qIn_{(1-p-q)}P$ or $Al_xGa_yIn_{(1-x-y)}N$, wherein $0 \leq p, q \leq 1$, $0 \leq x, y \leq 1$ and wherein p, q, x, and y are positive, and $(p+q) \leq 1$, $(x+y) \leq 1$. The first-type conductivity semiconductor layer 121 includes a first-type conductivity cladding layer. The second-type conductivity semiconductor layer 123 includes a second-type conductivity cladding layer.

Figure 2A:
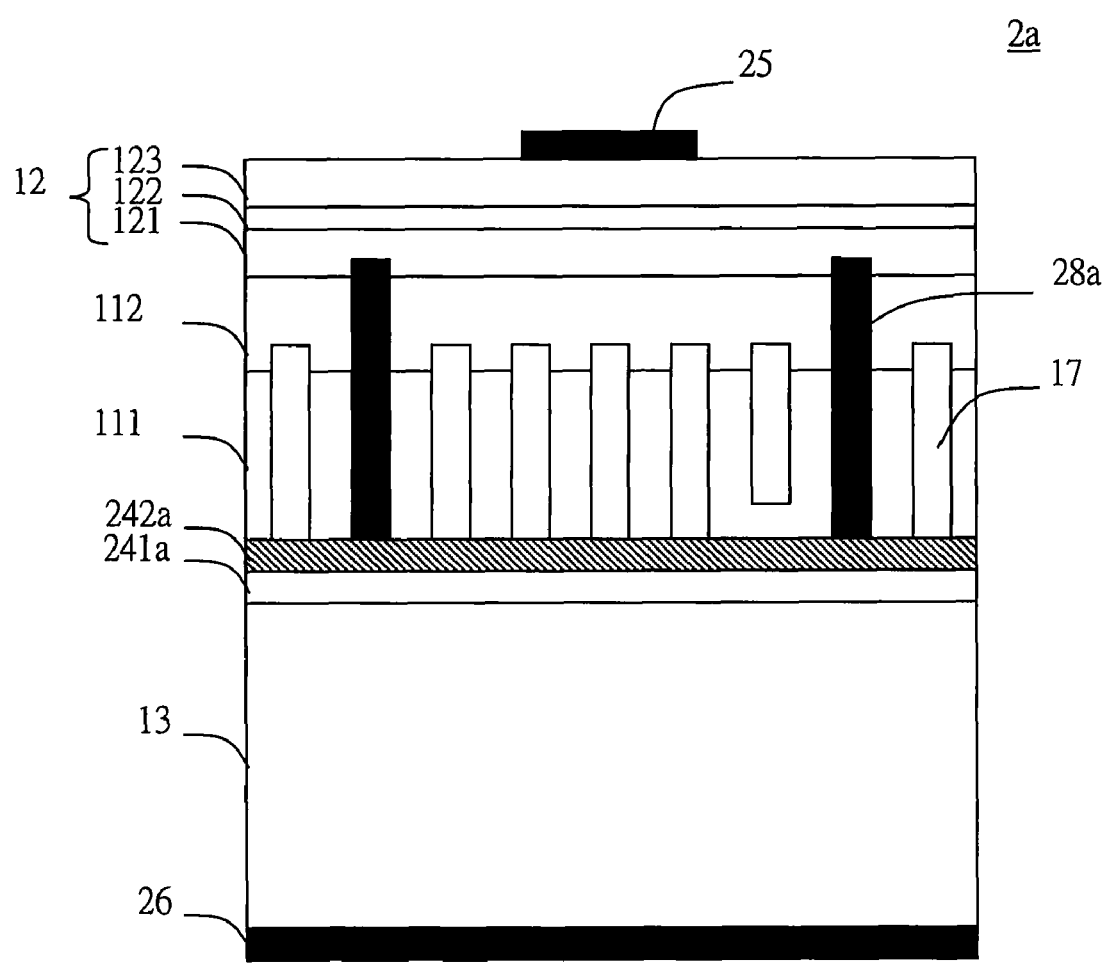
FIGS. 2A-2C are cross-sectional views of vertical light-emitting devices in accordance with a first to third embodiments of the present disclosure.
Figure 2B:
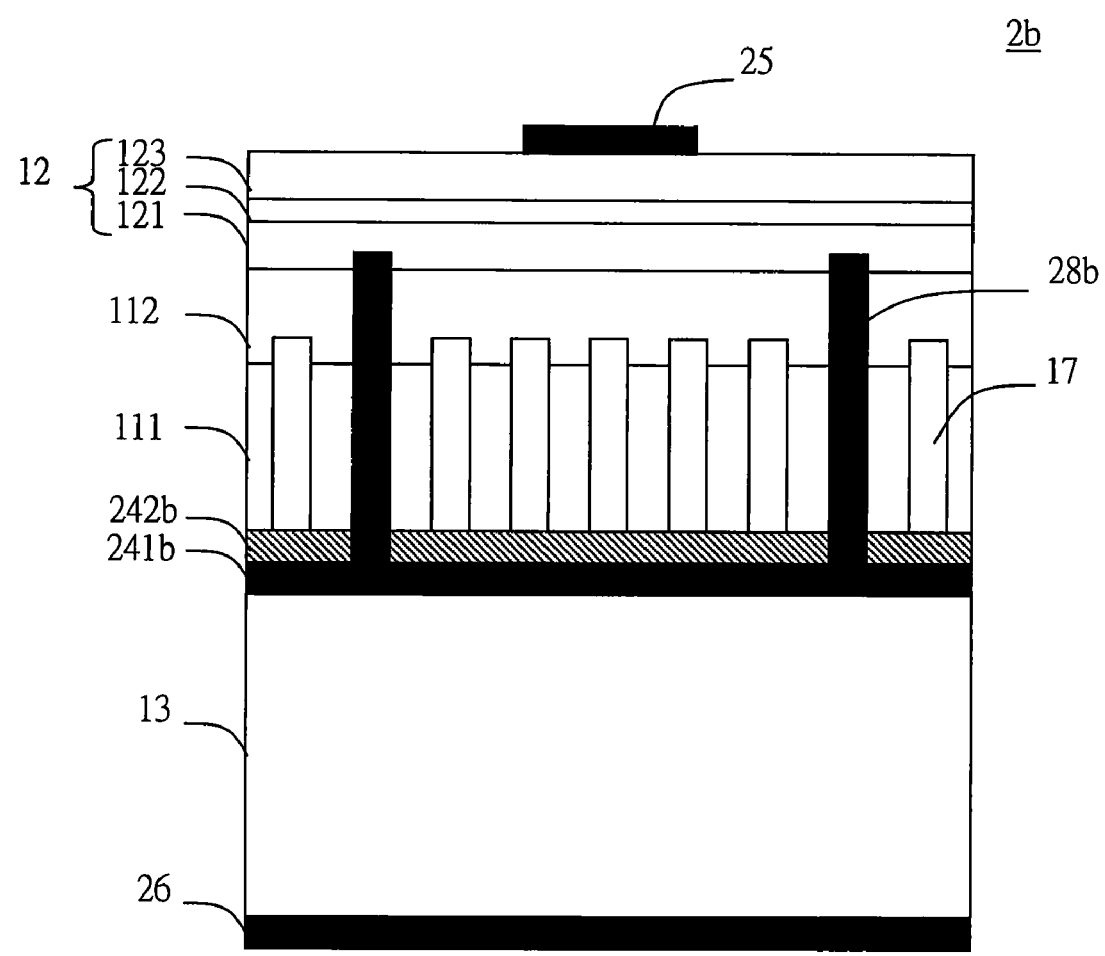
Figure 2C:
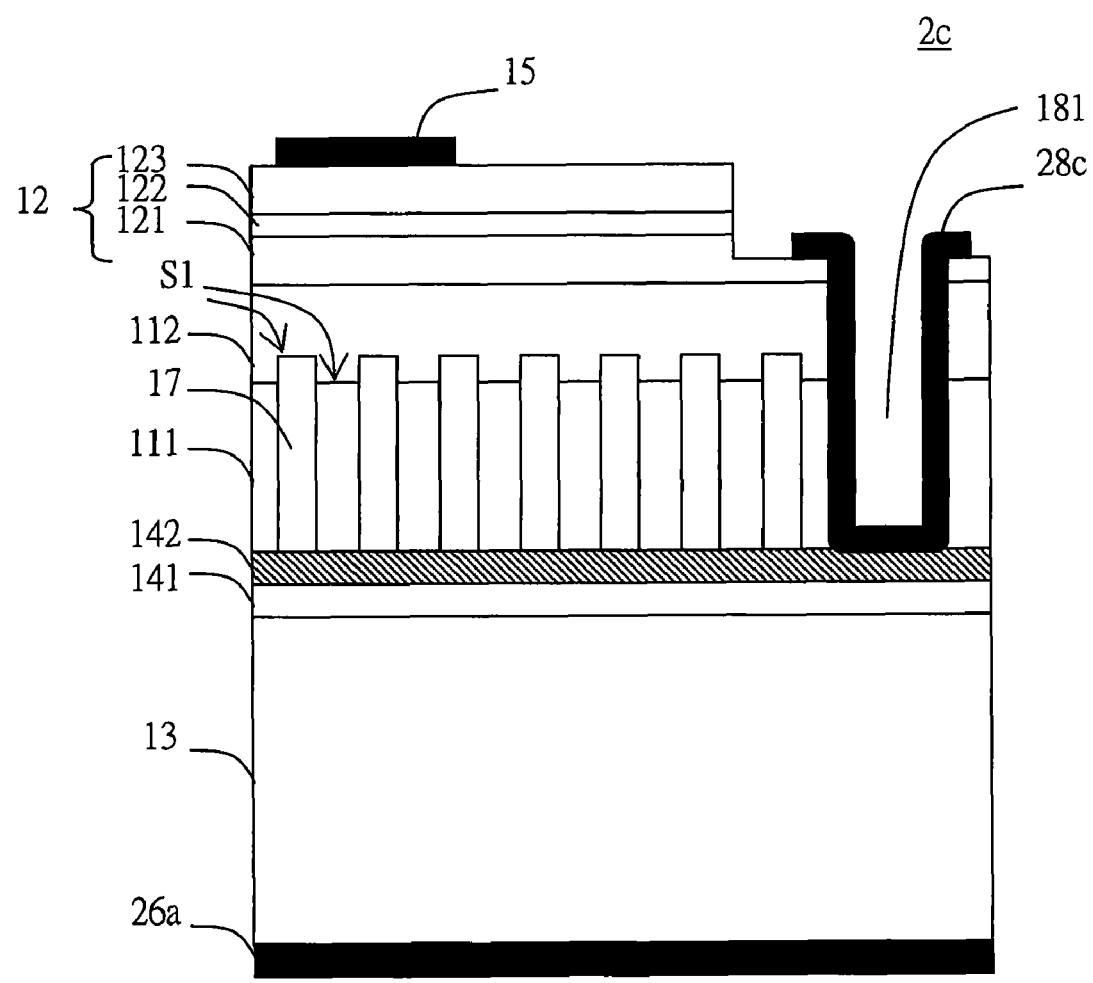

FIG. 2A shows the cross-sectional view of a vertical light-emitting device 2a in accordance with an embodiment of the present disclosure. Comparing with the light-emitting device 1 illustrated in FIG. 1, the first wire pad 25 and the second wire pad 26 of the light-emitting device 2a are deposited on the opposite side of the substrate. Besides, the light-emitting device 2a further includes at least a conductive channel 28a passing through the thinned substrate 111 and the semiconductor buffer layer 112 and electrically connecting with the first-type conductivity semiconductor layer 121. A reflective layer 242a and an intermediate layer 241a are conductive material. Under a forward bias, the circuit between the first wire pad 25 and the second wire pad 26 is connected. FIG. 2B shows a light-emitting device 2b with the conductive channel 28b passed through the reflective layer 242b composed of the same material with the intermediate layer 241b. FIG. 2C shows another vertical light-emitting device 2c. Comparing with the light-emitting device 2a illustrated in FIG. 2A, the semiconductor light-emitting structure 12 of the light-emitting device 2c is partially removed to expose part of the first-type conductivity semiconductor layer 121, and includes at least a conductive channel 28c extending from the exposed first-type conductivity semiconductor layer 121 to the reflective layer 142. The number and arrangement of the conductive channel 28a, conductive channel 28b, or conductive channel 28c is set to improve current spreading. Besides, the conductive channel 28a, conductive channel 28b, or conductive channel 28c has a higher thermal conductive coefficient than the first-type conductivity semiconductor layer 121 has so it could conduct heat generated from the semiconductor light-emitting structure 12 to the carrier 13. The material of the conductive channel 28a, conductive channel 28b, or conductive channel 28c includes thermal conductive material such as metal, metal alloy, metal oxide, or conductive polymer.

Figure 3A:
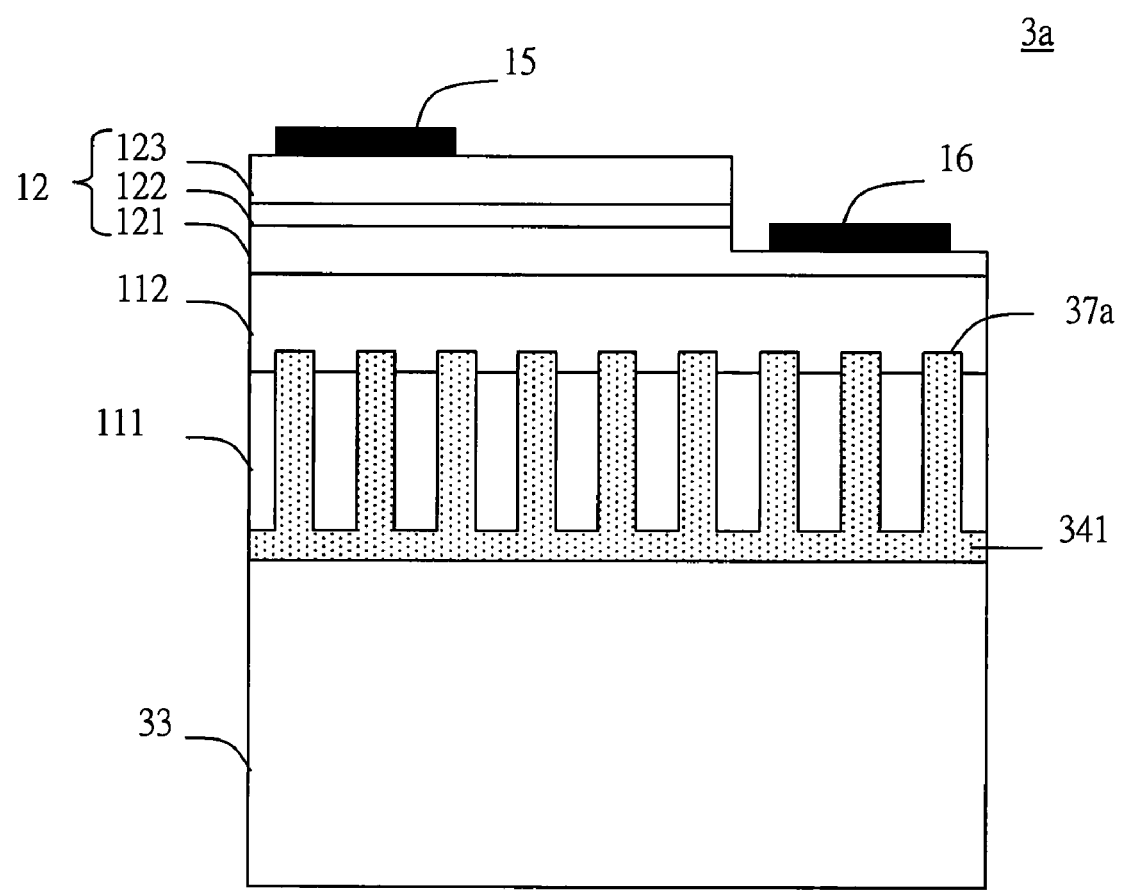
FIGS. 3A-3B are cross-sectional views of horizontal light-emitting devices in accordance with second to third embodiments of the present disclosure.
Figure 3B:
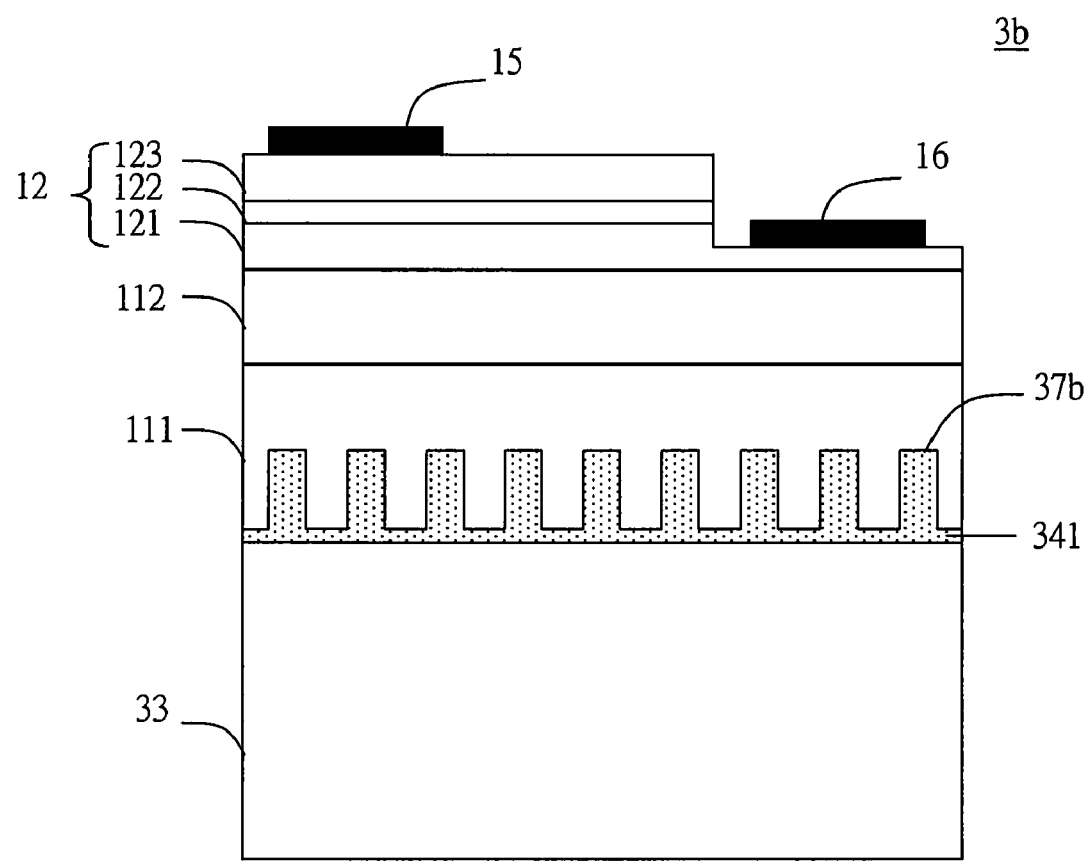

FIG. 3A shows the cross-sectional view of a horizontal light-emitting device 3a in accordance with another embodiment of the present disclosure. Comparing with the light-emitting device 1 illustrated in FIG. 1, the light-emitting device 3a includes a transparent carrier 33 and a multiple of transparent first channel 37a attached with the thinned substrate 111 by a transparent intermediate layer 341. Referring to FIG. 3B, channels 37b can also be formed in the thinned substrate 111 without passing through it. The transparent intermediate layer 341 could be a transparent adhesive layer, and the material includes organic polymer such as benzocyclobutene (BCB), perfluorocyclobutane (PFCB), epoxy, or silicone. The material of channels 37a and channels 37b includes transparent material such as silicide oxide, nitride oxide, organic polymer, or air, and the difference of refractive index between the channels 37a or channels 37b and the thinned substrate 111 is at least greater than 0.1 to increase the light extractive efficiency. The material of channels 37a and channels 37b also includes high thermal conductive transparent material such as gallium nitride, aluminium nitride, silicon carbide, or diamond to decrease the thermal resistivity of the device and increase the light extraction efficiency. The material of channels 37a and channels 37b can be the same as or different from that of the intermediate layer 341.

Figure 4:
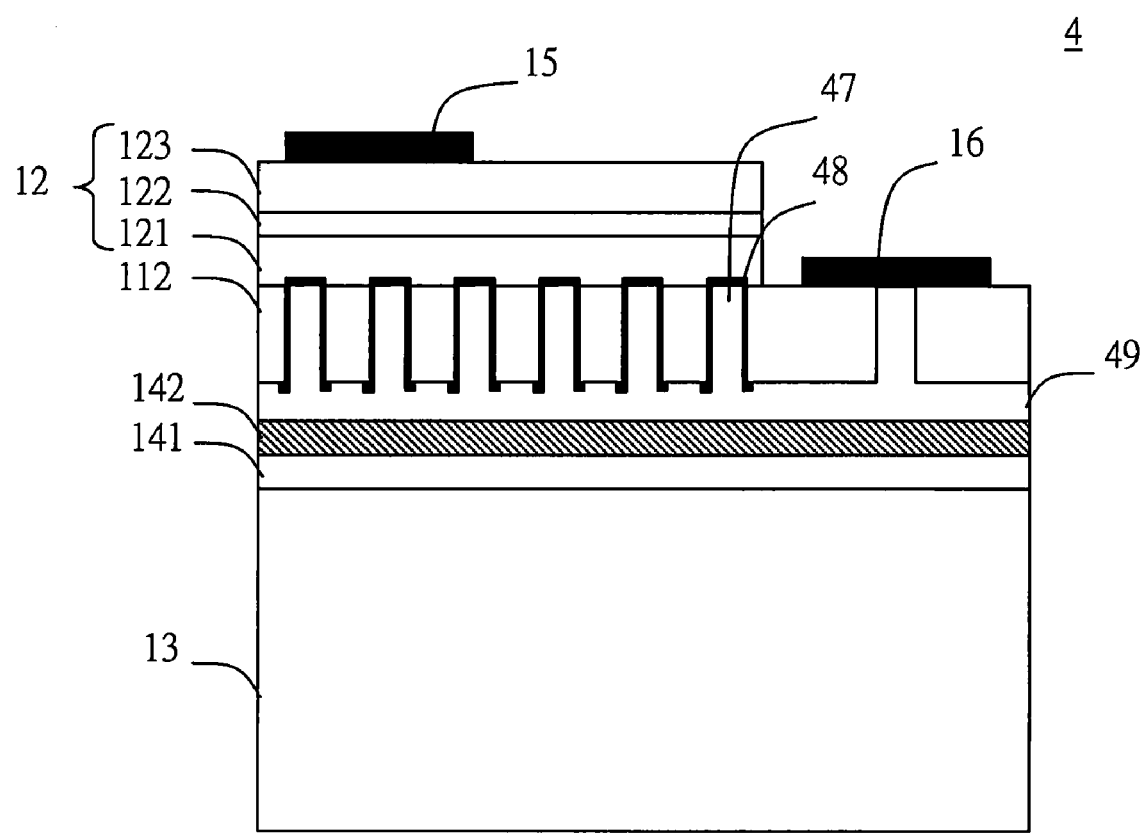
FIG. 4 is a cross-sectional view of a horizontal light-emitting device in accordance with fourth embodiment of the present disclosure.

FIG. 4 shows the schematic cross-sectional view of another horizontal light-emitting device 4 in accordance with another embodiment of the present disclosure. Comparing with the light-emitting device 1 illustrated in FIG. 1, the original growth substrate for growing the semiconductor buffer layer 112 and the semiconductor light-emitting structure 12 is removed completely after the growing step in the embodiment. The structure of the light-emitting device 4 includes the carrier 13, the intermediate layer 141 formed on the carrier 13, the reflective layer 142 formed on the intermediate layer 141, a current spreading layer 49 formed on the reflective layer 142, the semiconductor buffer layer 112 formed on the current spreading layer 49, the semiconductor light-emitting structure 12 formed on a first region of the semiconductor buffer layer 112 including the first-type conductivity semiconductor layer 121, the active layer 122, and the second-type conductivity semiconductor layer 123, the first wire pad 15 formed on the second-type conductivity semiconductor layer 123, the second wire pad 16 formed on a second region of the semiconductor buffer layer 112, multiple conductive channels 47 passing through the semiconductor buffer layer 112, wherein part of multiple conductive channels 47 form an electrical connection between the second wire pad 16 and the current spreading layer 49, and the other part of the multiple conductive channels 47 are formed between the first-type conductivity semiconductor layer 121 and the current spreading layer 49 for current spreading. The material of multiple conductive channels 47 and the current spreading layer 49 are transparent conductive material including metal oxide such as indium tin oxide, or semiconductor with a good conductivity, such as GaP or GaN doped with carbon, silicon or magnesium. The light-emitting device 4 further includes an ohmic contact layer 48 formed between the channels 47 and the first-type conductivity semiconductor layer 121 to decrease the interface resistance. The material of the ohmic contact layer 48 can be a semiconductor layer with a high carrier (electron or hole) concentration that is high enough to form an ohmic contact between the channels and the first-type conductivity semiconductor layer 121. In order to maintain the process reliability, the semiconductor buffer layer 112 has a thickness preferably to be greater than 2 μm to avoid a damage of the semiconductor light-emitting structure 12 resulted from variations produced by a difference in the growth substrate removing process. The thickness of the semiconductor buffer layer 112 is between about 2 μm and about 20 μm, and a better range of thickness is between about 2 μm and about 10 μm.

Figure 5A:
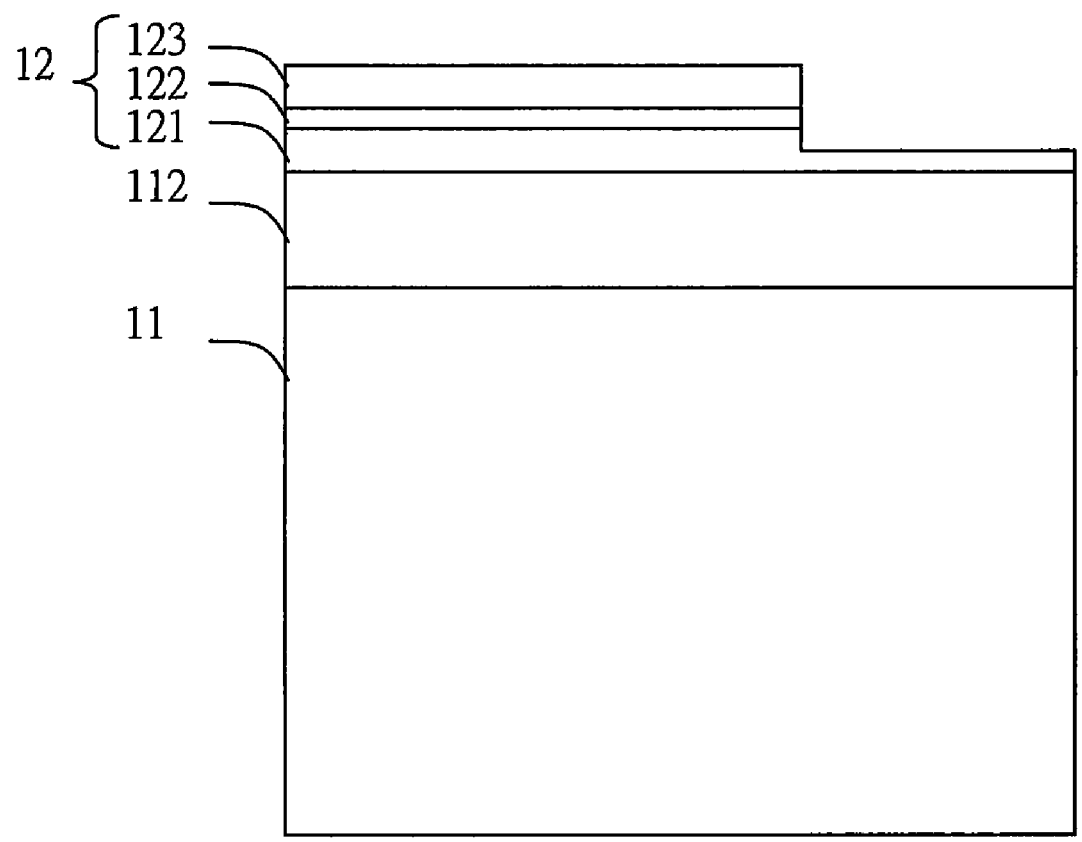
FIGS. 5A-5G are cross-sectional views of steps of manufacturing the light-emitting device illustrated in FIG. 2C.

FIGS. 5A-5G show a method for forming the light-emitting device 2c illustrated in FIG. 2C, and the method includes the following steps:

1. As shown in FIG. 5A, providing a growth substrate 11, and growing the semiconductor buffer layer 112 and the semiconductor light-emitting structure 12 including the first-type conductivity semiconductor layer 121, the active layer 122, and the second-type conductivity semiconductor layer 123 on a side of the growth substrate, then removing part of the semiconductor light-emitting structure 12 by a lithography etching method and exposing partial surface of the first-type conductivity semiconductor layer 121.

Figure 5B:
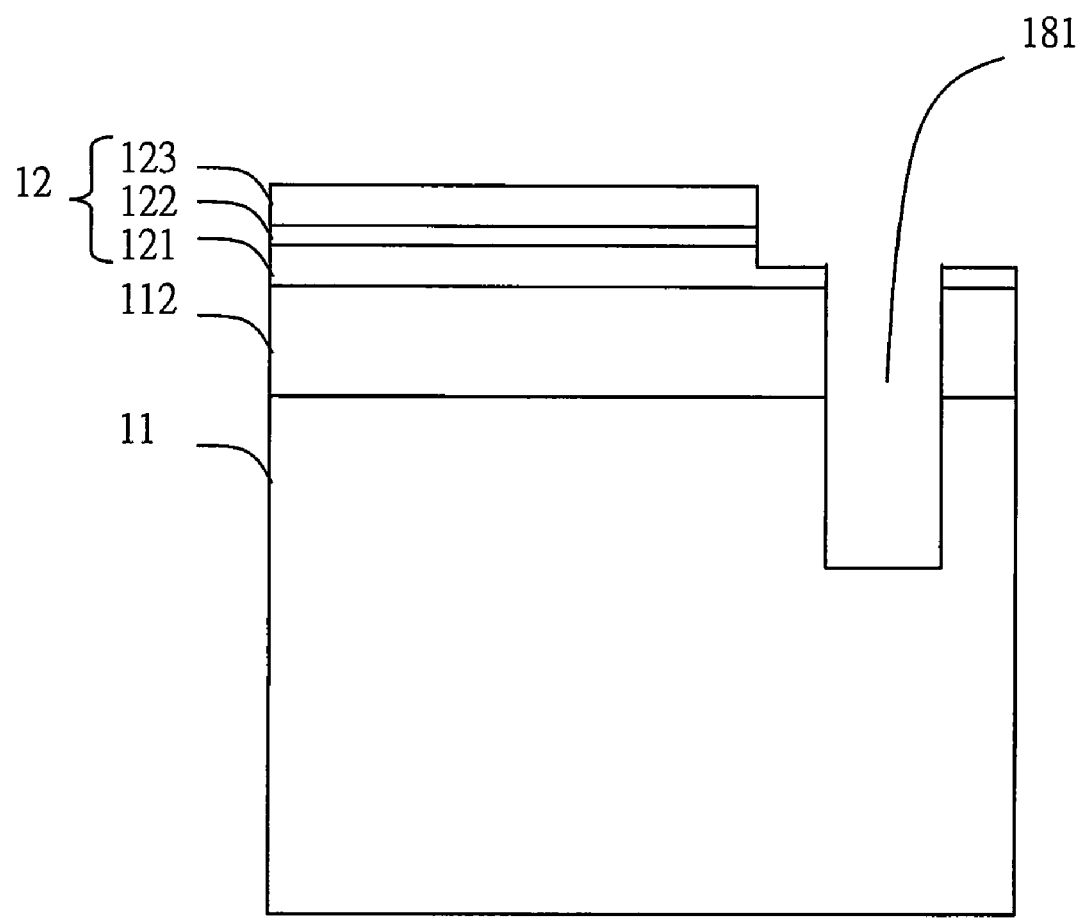

2. As shown in FIG. 5B, illuminating the exposed surface of the first-type conductivity semiconductor layer 121 to form a second channel 181 by $CO_2$ laser beam.

Figure 5C:
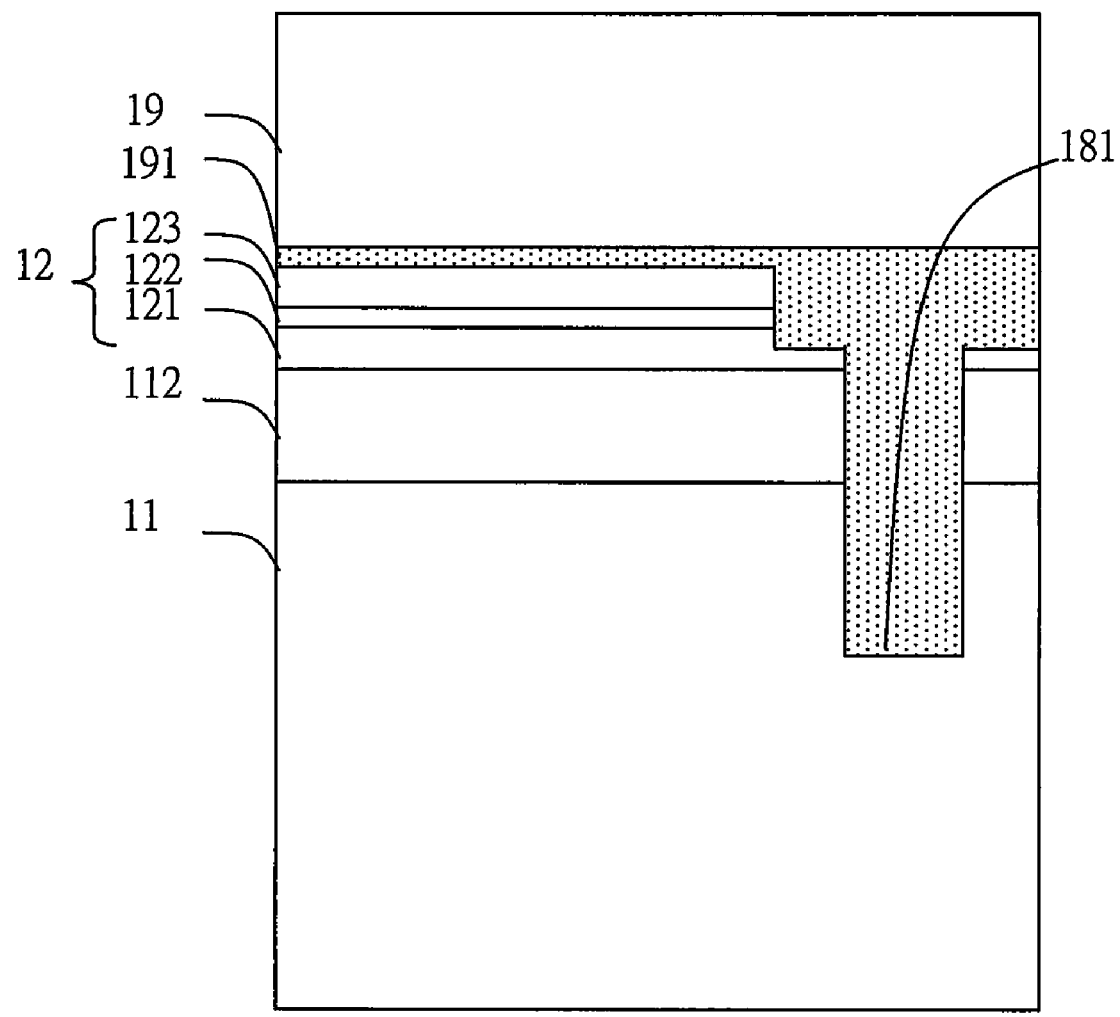

3. As shown in FIG. 5C, providing a holder 19 and attaching it to the surface of the semiconductor light-emitting structure 12 by an adhesive layer 191.

Figure 5D:
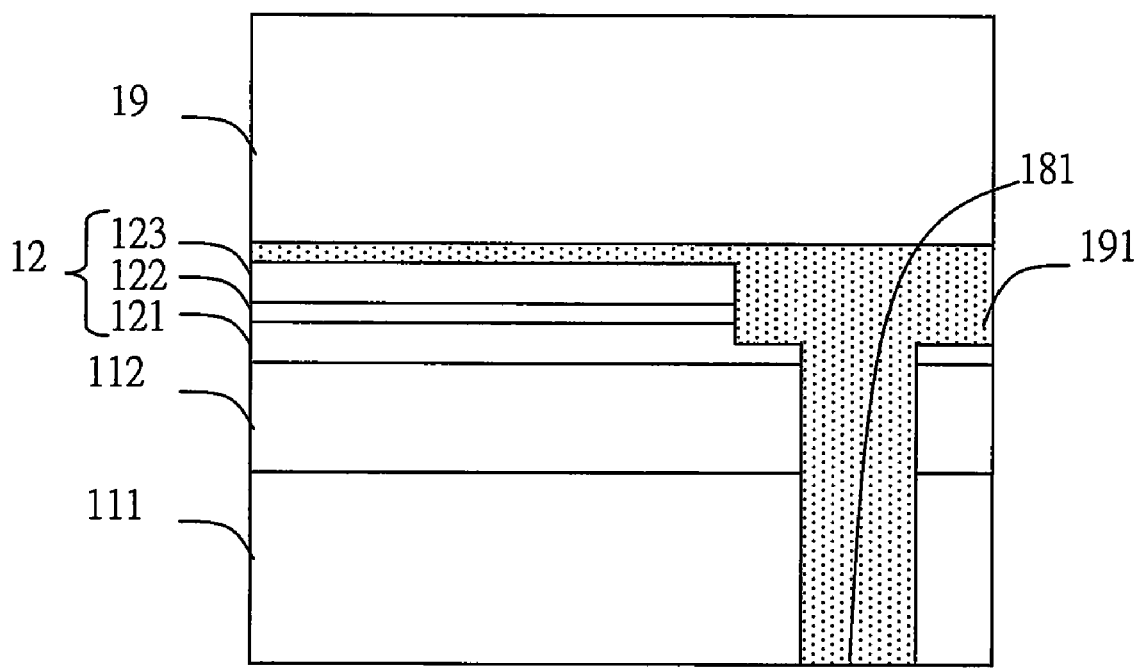

4. As shown in FIG. 5D, polishing another side of the growth substrate 11 until a predetermined thickness is achieved to form the thinned substrate 111, and exposing the second channel 181.

Figure 5E:
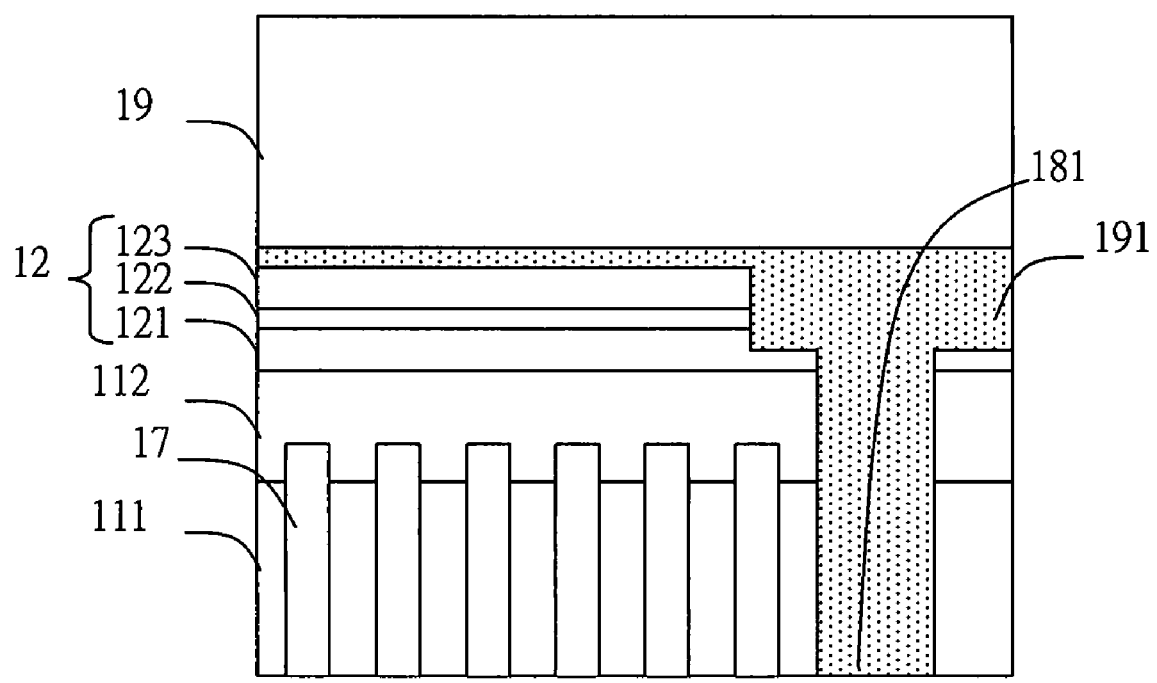

5. As shown in FIG. 5E, forming multiple first channels 17 from another side into the thinned substrate 111, passing through the thinned substrate and extending to a thickness of the semiconductor buffer layer 112, between 0.1-1 μm is better.

Figure 5F:
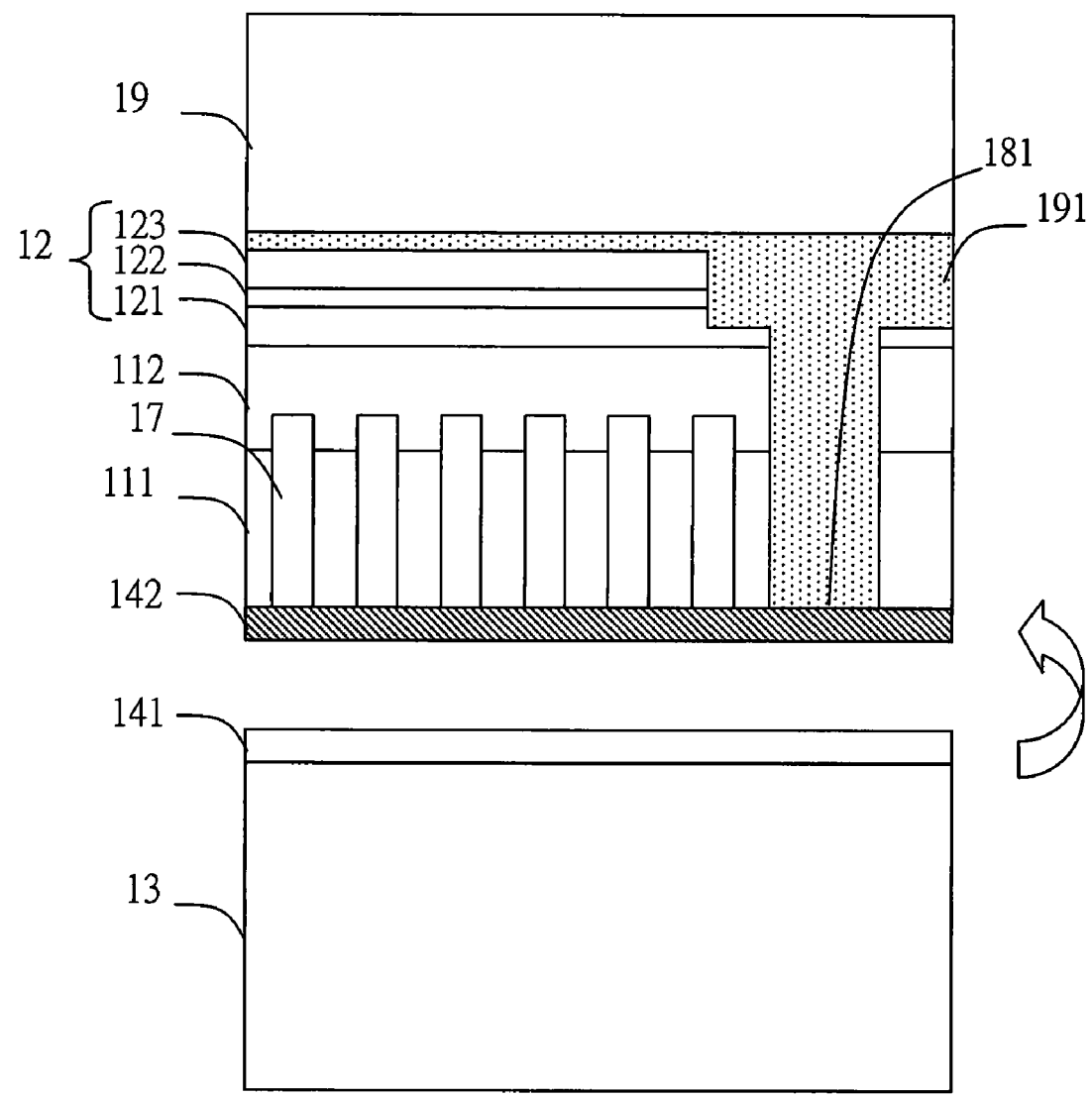

6. As shown in FIG. 5F, filling a transparent material or forming a void in the first channel 17, and then forming the reflective layer 142 on the surface of the thinned substrate 111.

7. Providing the carrier 13 and forming the intermediate layer 141 on the carrier.

8. Attaching the intermediate layer 141 and the carrier 13 to the reflective layer 142.

Figure 5G:
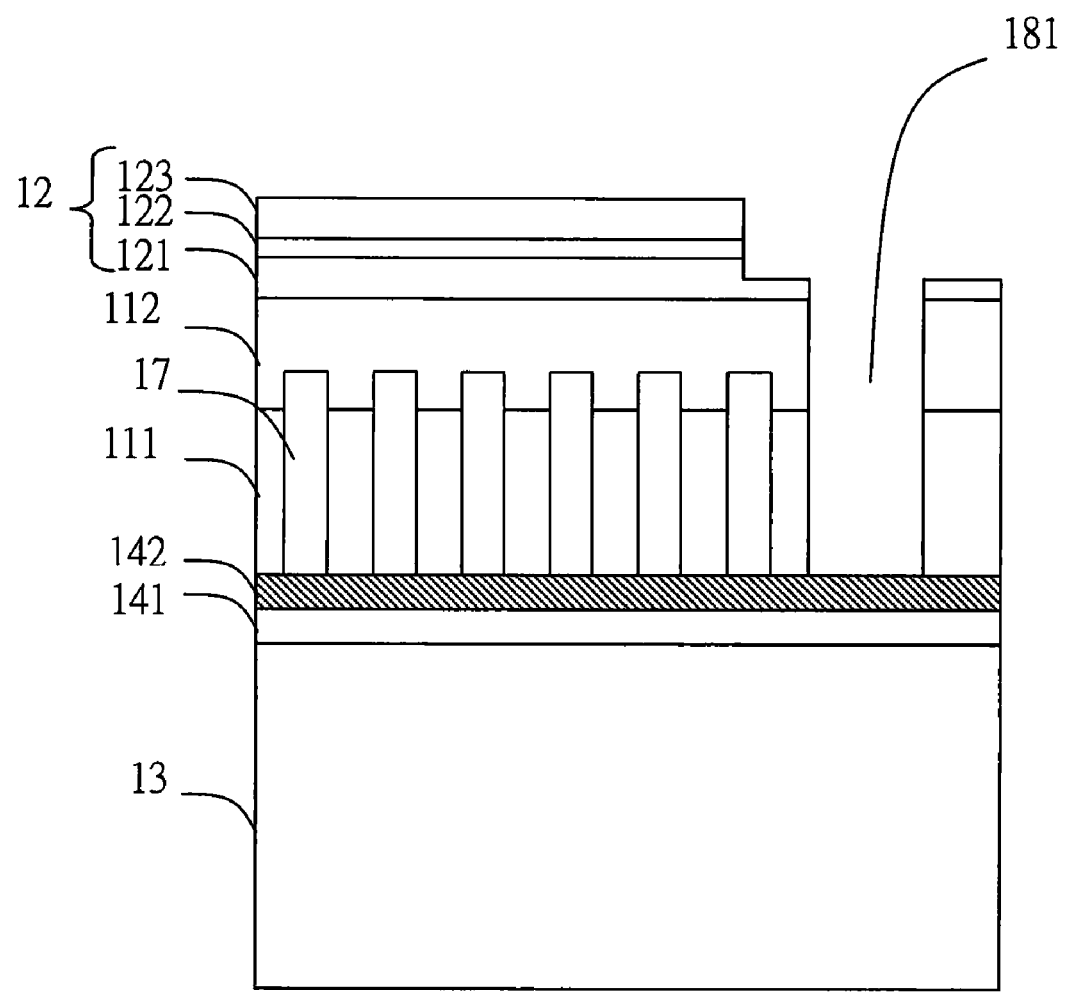

9. As shown in FIG. 5G, removing the adhesive layer 191 and the holder 19.

10. As shown in FIG. 2C illustrating the light-emitting device 2c, covering a conductive material in the second channel 181 for forming the conductive channel 28c, and forming the first wire pad 15 on the second conductive semiconductor layer 123, and forming the second wire pad 26a on the outside surface of the carrier 13.

The polish method of step 4 includes chemical mechanical polishing (CMP), using a CMP apparatus physically or chemically to remove the substrate by polishing pad and chemical slurry. In one embodiment of the present disclosure, the material of the growth substrate is sapphire with a thickness of about 200 μm to 400 μm. The chemical slurry includes chemical reactive polishing particles such as silica gel distributed in KOH solution that can react with sapphire to form $Al_2Si_2O_7$ which is able to be polished away during polish step. In one embodiment, the size of the gel can be with a diameter of smaller than about 0.1 μm to form a smooth surface. In another embodiment, the size of the gel can be with a diameter between about 0.1 μM and about 1 μm to form a scattering surface having a dimension similar to the light wavelength. In order to achieve both polishing efficiency and a good uniformity, and avoid over-polishing that damages the semiconductor light-emitting structure 12, it is preferred to adopt a method with a high polishing speed at the beginning, such as only using a mechanical polishing method to polish the substrate to reach a target value by a traditional polishing apparatus, for example, polishing the sapphire substrate quickly with a 100 μm/hr polishing speed to about 60 μm (the target value is 20 μm). Then a chemical mechanical polishing apparatus is used to increase the uniformity and accuracy through a chemical mechanical polishing method, for example, polishing with a silica gel with a diameter of about 1 μm and a polishing speed of about 60 μm/hr. Besides, if the growth substrate is removed completely by polishing which stops at or in the semiconductor buffer layer 112 as described in the embodiment shown in FIG. 4, the material that are not able to react or reacts poorly with the silica, such as gallium nitride material, can be adopted as the material of the semiconductor buffer layer 112 to form a stopping layer for removing sapphire substrate. A small gel such as silica gel with a diameter of about 0.1 μm can also be used to increase the selectivity between the sapphire substrate and the semiconductor buffer layer 112 (for example, the polishing speed ratio of the sapphire substrate to the semiconductor buffer layer 112). The polishing speed of the silica gel is about 6 μm/hr in the sapphire substrate, the polishing speed of the silica gel is about 1 μm/hr in the GaN semiconductor buffer layer 112, and the selectivity between the sapphire substrate and the GaN semiconductor buffer layer 112 is about 6.

In step 9, the intermediate layer 141 is an adhesive layer for adhering the carrier 13 and the thinned substrate 111. The adhesive layer 141 can be an organic adhesive layer or metal adhesive layer. In another embodiment, the intermediate layer 141 is a seed layer for electroplating and the carrier 13 is electroplated on it. The intermediate layer 141 further includes a diffusion barrier layer formed between the reflective layer 142 and the seed layer for electroplating to inhibit a cross diffusion between the intermediate layer 141 and the carrier 13 that affects the material characteristic.

Figure 6A:
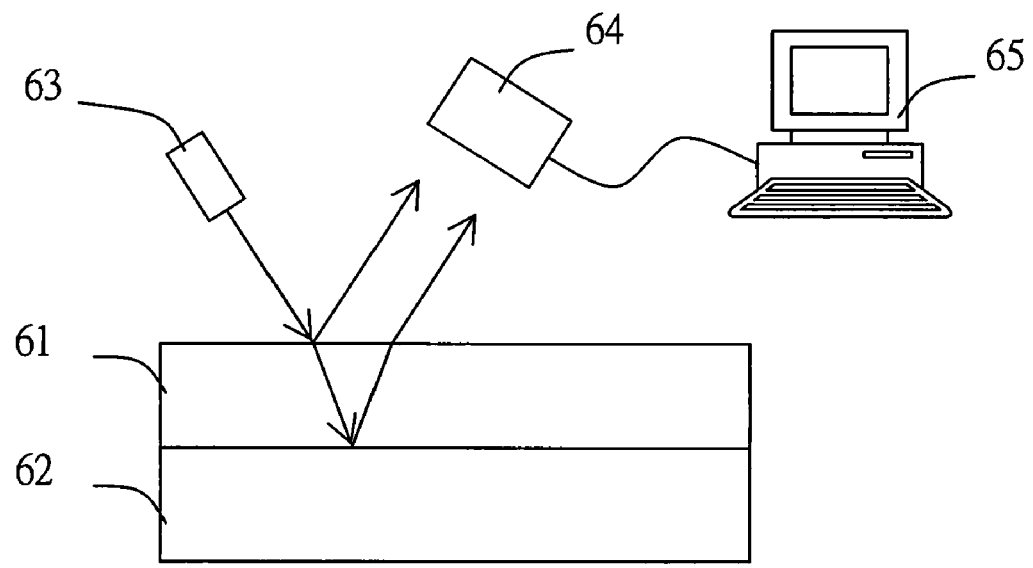
FIG. 6A is a schematic view of an ellipsometry.
Figure 6C:
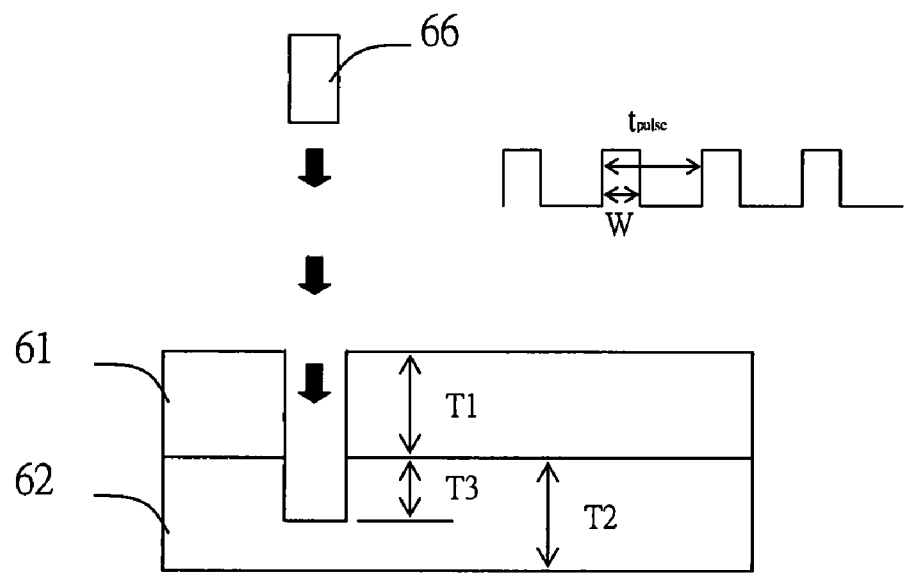
FIG. 6C is a schematic view of a structure having the channel formed by laser beam.
Figure 6B:
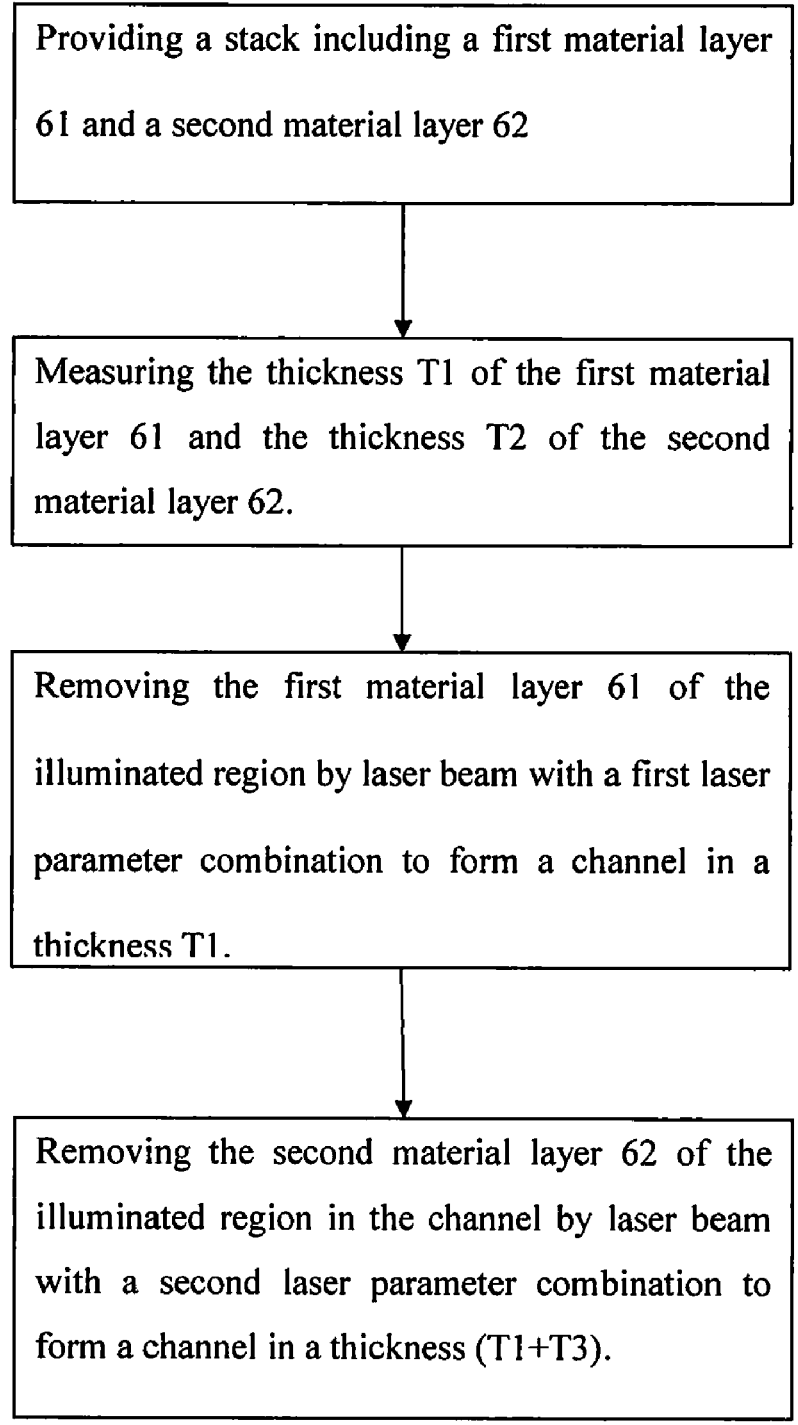
FIG. 6B is a schematic view of each step of forming a channel by laser beam.

FIGS. 6A-6C show an apparatus and a method of forming a channel through a laser beam illuminating in step 2 or step 5. FIG. 6A shows a schematic view of a traditional ellipsometry 6 for thickness measurement including a stack having a first material 61 and a second material 62, a laser 63, a laser receiver 64, and a data calculation apparatus 65 for calculating the thickness of the first material 61 and the second material 62 before forming the channel. Referring to FIGS. 6B and 6C, a method including following steps in accordance with the present disclosure is described:

1. Providing a stack including a first material layer 61 (such as GaN or the layers 121 and 112 in FIG. 2C) and a second material layer 62 (such as sapphire or layer 111 in FIG. 2C).
2. Measuring the thickness T1 of the first material layer 61 and the thickness T2 of the second material layer 62.
3. Removing the first illuminated region of the first material layer 61 by laser beam with a first laser parameter combination to form a channel in a thickness T1 and expose the second material layer 62.
4. Removing the second illuminated region of the second material layer 62 by laser beam with a second laser parameter combination in the channel formed in step 3 and forming a channel in a thickness of about (T1+T3), wherein T3≦T2.

The first and second laser parameter combinations mentioned above include the kind of laser, intensity, pulse cycle $t_{pulse}$, or pulse width W to tune the illustrating intensity and illustrating period, and further control the removing depth and removing efficiency.

It will be apparent to those having ordinary skill in the art that various modifications and variations can be made to the structure of the present disclosure without departing from the scope or spirit of the invention. In view of this, it is intended that the present invention covers modifications and variations of this invention provided they fall within the scope of the following claims and their equivalents.

What is claimed is:

1. A semiconductor light-emitting device comprising:
   a thinned structure, comprising a first surface and a second surface;
   a semiconductor light-emitting structure deposed on the first surface of the thinned structure;
   a carrier deposed on the second surface of the thinned structure,
   at least one channel formed to pass through the first surface of the thinned structure, and extending into the semiconductor light-emitting structure with a depth less than a thickness of the semiconductor light-emitting structure; and
   an intermediate layer formed between the thinned structure and the carrier.

2. A semiconductor light-emitting device according to claim 1, wherein the semiconductor light-emitting structure comprises a first-type conductivity semiconductor layer, an active layer, and a second-type conductivity semiconductor layer.

3. A semiconductor light-emitting device according to claim 2, wherein the at least one channel merely extends into one of the first-type conductivity semiconductor layer and the second-type conductivity semiconductor layer.

4. A semiconductor light-emitting device according to claim 1, wherein the thinned structure comprises a thinned growth substrate.

5. A semiconductor light-emitting device according to claim 1, wherein the thinned structure comprises a semiconductor buffer layer.

6. A semiconductor light-emitting device according to claim 1, wherein the thinned structure comprises at least one material selected from the group consisting of GaAs, sapphire, SiC, GaN, and AlN.

7. A semiconductor light-emitting device according to claim 1, comprising multiple channels.

8. A semiconductor light-emitting device according to claim 7, wherein the multiple channels are arranged in a periodic, a quasi-periodic, varied periodic, or irregular order.

9. A semiconductor light-emitting device according to claim 7, wherein a contact surface between the semiconductor light-emitting structure and the multiple channels is a concave-convex surface.

10. A semiconductor light-emitting device according to claim 7, wherein the multiple channels are cylinder.

11. A semiconductor light-emitting device according to claim 7, wherein the multiple channels comprises a first group of channels and a second group of channels, the first group of channels comprising the at least one channel, the second group of channels merely formed in the thinned structure.

12. A semiconductor light-emitting device according to claim 11, wherein the first group of channels electrically connects the semiconductor light-emitting structure and the carrier.

13. A semiconductor light-emitting device according to claim 12, wherein the first group of channels comprises conductive material selected from the group consisting of metal, metal alloy, metal oxide, conductive polymer, and combinations thereof.

14. A semiconductor light-emitting device according to claim 11, wherein the second group of channels comprises at least one material selected from the group consisting of silicide oxide, nitride oxide, organic polymer, air, gallium nitride, aluminium nitride, silicon carbide, zinc oxide and diamond.

15. A semiconductor light-emitting device according to claim 1, wherein a difference between the refractive index of the channel and the refractive index of the thinned structure is at least greater than 0.1.

16. A semiconductor light-emitting device according to claim 1, wherein the intermediate layer comprises an adhesive layer.

17. A semiconductor light-emitting device according to claim 16, wherein the adhesive layer comprises a transparent adhesive layer.

18. A semiconductor light-emitting device according to claim 16, wherein the adhesive layer comprises a conductive adhesive layer.

19. A semiconductor light-emitting device according to claim 16, wherein the adhesive layer comprises a diffusion barrier layer.

20. A semiconductor light-emitting device according to claim 1, further comprising a reflective layer formed between the thinned structure and the carrier.

21. A semiconductor light-emitting device according to claim 1, wherein the intermediate layer further comprises an electroplating seed layer.

22. A semiconductor light-emitting device according to claim 21, wherein the carrier comprises an electroplating metal layer.

23. A semiconductor light-emitting device according to claim 1, wherein the carrier comprises a composite material.

24. A semiconductor light-emitting device according to claim 23, wherein the composite material comprises a material with a high thermal conductive coefficient and a material with a low expansive coefficient.

25. A semiconductor light-emitting device according to claim 1, wherein the thermal conductive coefficient of the carrier is not less than that of the thinned structure.

26. A semiconductor light-emitting device according to claim 1, wherein the semiconductor light-emitting structure comprises AlGaInP or AlInGaN based material.

27. A semiconductor light-emitting device according to claim 1, wherein the thickness of the thinned structure is less than 20 μm.

28. A semiconductor light-emitting device according to claim 1, wherein the thickness of the thinned structure is less than 5 μm.

29. A semiconductor light-emitting device according to claim 1, further comprising a first wire pad formed on the semiconductor light-emitting structure, and a second wire pad formed on the carrier.

* * * * *